US011646285B2

United States Patent
Son et al.

(10) Patent No.: US 11,646,285 B2
(45) Date of Patent: May 9, 2023

(54) SEMICONDUCTOR PACKAGE USING CORE MATERIAL FOR REVERSE REFLOW

(71) Applicant: MK ELECTRON CO., LTD., Yongin-si (KR)

(72) Inventors: Jae Yeol Son, Yongin-si (KR); Jeong Tak Moon, Suwon-si (KR); Jae Hun Song, Yongin-si (KR); Young Woo Lee, Yongin-si (KR); Seul Gi Lee, Yongin-si (KR); Min Su Park, Yongin-si (KR); Hui Joong Kim, Seoul (KR)

(73) Assignee: MK ELECTRON CO., LTD., Gyeonggi-Do (KR)

( * ) Notice: Subject to any disclaimer, the term of this patent is extended or adjusted under 35 U.S.C. 154(b) by 29 days.

(21) Appl. No.: 17/323,705

(22) Filed: May 18, 2021

(65) Prior Publication Data

US 2021/0366858 A1 Nov. 25, 2021

(30) Foreign Application Priority Data

May 19, 2020 (KR) .................. 10-2020-0059922

(51) Int. Cl.
*H01L 23/00* (2006.01)
(52) U.S. Cl.
CPC .............. *H01L 24/13* (2013.01); *H01L 24/05* (2013.01); *H01L 24/81* (2013.01);
(Continued)
(58) Field of Classification Search
CPC ..................................................... H01L 24/03
See application file for complete search history.

(56) References Cited

U.S. PATENT DOCUMENTS

| 5,931,371 A * | 8/1999 | Pao | ................... | B23K 35/0244 257/E21.511 |
| 6,324,754 B1 * | 12/2001 | DiStefano | .............. | H05K 1/111 361/764 |

(Continued)

FOREIGN PATENT DOCUMENTS

| KR | 2016-0126839 | 11/2016 |
| KR | 2018-0043629 | 4/2018 |
| KR | 10-2018-0101254 | 9/2018 |

OTHER PUBLICATIONS

Korean Office Action dated Apr. 26, 2022 in Korean Application No. 10-2020-0059922 with English translation.

(Continued)

*Primary Examiner* — William A Harriston
(74) *Attorney, Agent, or Firm* — Crowell & Moring, L.L.P.

(57) ABSTRACT

Provided is a semiconductor package including a first bump pad on a first substrate, a second bump pad on a second substrate, a core material for reverse reflow between the first bump pad and the second bump pad, and a solder member forming a solder layer on the core material for reverse reflow. The solder member is in contact with the first bump pad and the second bump pad. Each of a first diameter of the first bump pad and a second diameter of the second bump pad is at least about 1.1 times greater than a third diameter of the core material for reverse reflow. The core material for reverse reflow includes a core, a first metal layer directly coated on the core, and a second metal layer directly coated on the first metal layer.

6 Claims, 19 Drawing Sheets

(52) U.S. Cl.
CPC ............... *H01L 2224/0401* (2013.01); *H01L 2224/13147* (2013.01); *H01L 2224/13582* (2013.01); *H01L 2224/13644* (2013.01); *H01L 2224/13655* (2013.01); *H01L 2224/13657* (2013.01); *H01L 2224/13669* (2013.01); *H01L 2224/16014* (2013.01); *H01L 2224/81815* (2013.01)

(56) References Cited

U.S. PATENT DOCUMENTS

| | | | | |
|---|---|---|---|---|
| 6,369,451 | B2* | 4/2002 | Lin | B23K 3/0623 |
| | | | | 257/E21.511 |
| 6,433,425 | B1* | 8/2002 | Sarkhel | H01L 23/488 |
| | | | | 257/737 |
| 6,518,667 | B1* | 2/2003 | Ichida | H01L 23/49816 |
| | | | | 257/734 |
| 7,960,025 | B2* | 6/2011 | Fernandez Camacho | ............... B82Y 30/00 |
| | | | | 977/773 |
| 9,564,255 | B2* | 2/2017 | Sagawa | H01B 1/026 |
| 9,818,736 | B1 | 11/2017 | Orikasa et al. | |
| 9,837,668 | B2* | 12/2017 | Cerri | B01J 23/6484 |
| 2008/0237302 | A1* | 10/2008 | Kinoshita | H05K 3/3436 |
| | | | | 228/56.3 |
| 2014/0193746 | A1* | 7/2014 | Cerri | H01M 4/921 |
| | | | | 502/339 |
| 2016/0244891 | A1* | 8/2016 | Son | B23K 35/0244 |
| 2016/0315040 | A1* | 10/2016 | Son | H01L 23/49811 |
| 2019/0013286 | A1* | 1/2019 | Murayama | H01L 24/13 |
| 2020/0061757 | A1* | 2/2020 | Nishino | B22F 1/17 |

OTHER PUBLICATIONS

Korean Office Action dated Sep. 9, 2021 in corresponding Korean Application No. 10-2020-0059922, which English translation.

\* cited by examiner

SEMICONDUCTOR PACKAGE USING CORE MATERIAL FOR REVERSE REFLOW

CROSS-REFERENCE TO RELATED APPLICATION

This application is based on and claims priority under 35 U.S.C. § 119 to Korean Patent Application No. 10-2020-0059922, filed on May 19, 2020, in the Korean Intellectual Property Office, the disclosure of which is incorporated by reference herein in its entirety.

BACKGROUND

1. Field

One or more embodiments relate to a semiconductor package using a core material for reverse reflow and a method of manufacturing the semiconductor package, and more particularly, to a semiconductor package using a core material for reverse reflow to maintain a constant gap height between a stacked semiconductor package and/or a printed circuit board (PCB), and a method of manufacturing the semiconductor package.

2. Description of the Related Art

A tin (Sn)-lead (Pb)-based alloy product is mainly used as solder used in electronic products. In particular, lead acts as a component that determines the wetting, strength, and mechanical properties of an alloy. By including lead in an alloy, a melting point of the alloy may be lowered to about 183° C., thereby preventing thermal damage caused by a soldering process in a semiconductor process. Moreover, as regulations regarding environmental problems caused by lead become stricter, a ternary lead-free solder alloy including tin (Sn), silver (Ag), and copper (Cu) has been proposed. To enable high-density mounting of a semiconductor package, after a metal or nonmetal core material is plated with nickel (Ni), plating balls including a binary plating layer including tin and silver or a ternary plating layer including tin, silver, and copper are being used to transmit an electric signal to the semiconductor package. Various studies are being conducted on methods of applying such plating balls.

SUMMARY

One or more embodiments include a semiconductor package having a high precision and an excellent bonding strength by maintaining a gap height between a stacked semiconductor package and/or a printed circuit board (PCB) constant.

One or more embodiments include a method of manufacturing a semiconductor package, by which a semiconductor package may be manufactured at high precision by maintaining a gap height between a stacked semiconductor package and/or a PCB constant.

One or more embodiments include an electronic system including a semiconductor package having a high precision and an excellent bonding strength by maintaining a gap height between a stacked semiconductor package and/or a PCB constant.

Aspects of the inventive concept should not be limited by the above description, and other unmentioned aspects will be clearly understood by one of ordinary skill in the art from example embodiments described herein.

Additional aspects will be set forth in part in the description which follows and, in part, will be apparent from the description, or may be learned by practice of the presented embodiments of the disclosure.

According to one or more embodiments, a semiconductor package includes a first bump pad on a first substrate, a second bump pad on a second substrate, a core material for reverse reflow between the first bump pad and the second bump pad, and a solder member forming a solder layer on the core material for reverse reflow. The solder member is in contact with the first bump pad and the second bump pad. Each of a first diameter of the first bump pad and a second diameter of the second bump pad is at least about 1.1 times greater than a third diameter of the core material for reverse reflow. The core material for reverse reflow includes a core, a first metal layer directly coated on the core, and a second metal layer directly coated on the first metal layer. The first metal layer includes nickel (Ni) or cobalt (Co), and the second metal layer includes gold (Au) or platinum (Pt).

According to one or more embodiments, a method of manufacturing a semiconductor package includes providing a first substrate on which a first bump pad is located. A second substrate is provided on which a second bump pad is located. First solder paste is dotted on the first bump pad. Second solder paste is dotted on the second bump pad. A core material for reverse reflow is arranged on the first solder paste. The second solder paste is arranged on the core material for reverse reflow such that the first bump pad and the second bump pad face each other. A reflow process is performed such that the first solder paste and the second solder paste are bonded to each other to form a solder member. Each of a first diameter of the first bump pad and a second diameter of the second bump pad is at least about 1.1 times greater than a third diameter of the core material for reverse reflow. The core material for reverse reflow includes a core, a first metal layer directly coated on the core, and a second metal layer directly coated on the first metal layer. The first metal layer includes nickel or cobalt. The second metal layer includes gold or platinum.

According to one or more embodiments, a method of manufacturing a semiconductor package includes providing a first substrate on which a first bump pad is located, providing a second substrate on which a second bump pad is located, adhering a solder ball onto the first bump pad, performing a first reflow process such that the solder ball spreads on the first bump pad to form a solder member of which a top surface is rounded, planarizing the top surface of the solder member by applying a mechanical pressure to the solder member, arranging a core material for reverse reflow on the top surface of the solder member, performing a second reflow process on the solder member to form a solder layer on an entire surface of the core material for reverse reflow, and arranging the second bump pad on the solder member such that the first bump pad and the second bump pad face each other. Each of a first diameter of the first bump pad and a second diameter of the second bump pad is at least about 1.1 times greater than a third diameter of the core material for reverse reflow. The core material for reverse reflow includes a core, a first metal layer directly coated on the core, and a second metal layer directly coated on the first metal layer. The first metal layer includes nickel or cobalt. The second metal layer includes gold or platinum.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
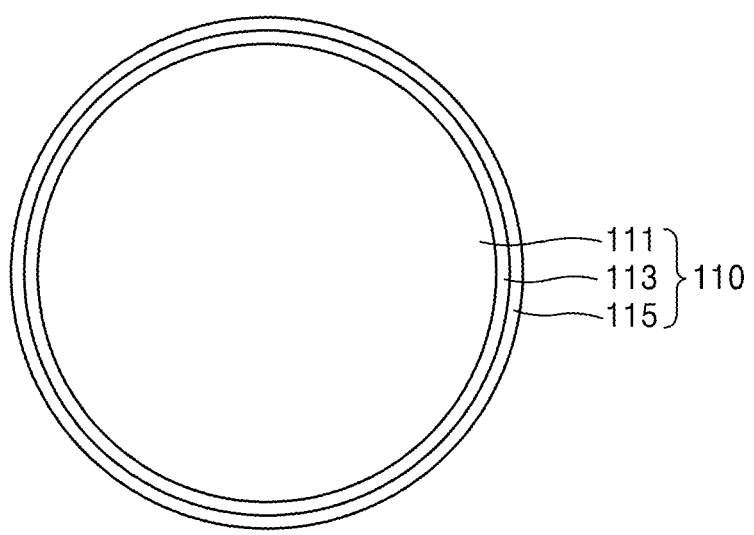
FIG. 1 is a cross-sectional view of a core material for reverse reflow, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Embodiments will now be described in further detail with reference to the accompanying drawings. Embodiments may, however, be embodied in many different forms and should not be construed as limited to the embodiments set forth herein.

Like numbers refer to like elements throughout. Furthermore, various elements and regions are approximately illustrated in the drawings. Accordingly, the scope of the inventive concept is not limited by relative sizes or intervals in the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

FIG. 1 is a cross-sectional view of a core material 110 for reverse reflow, according to an embodiment.

Referring to FIG. 1, the core material 110 for reverse reflow may include a core 111, a first metal layer 113 coated on the core 111, and a second metal layer 115 coated on the first metal layer 113.

The core 111 may include a typical metal material, an organic material, an organic/organic composite material, or an organic/inorganic composite material.

The core 111 including the organic material may be, for example, the core 111 including a plastic material. The core 111 including the plastic material may include a plastic core including a thermosetting resin; a plastic core including a thermoplastic resin; and an elastic core. The thermosetting resin may include epoxies, melamine-formaldehydes, benzoguanamine-formaldehydes, divinylbenzene, divinyl ether, polydiacrylate, and alkylene bisacrylamide. The thermoplastic resin may include polyvinyl chloride, polyethylene, polystyrene, nylon, and polyacetal. The elastic core may include natural rubber and synthetic rubber. Furthermore, the core 111 may include a plastic core including a resin mixture of a thermosetting resin and a thermoplastic resin.

Moreover, the core 111 including the plastic material may be formed using a polymer synthesis method. In some embodiments, the core 111 including the plastic material may be formed to have a diameter of about 21 μm to about 500 μm by using a synthesis method, such as a suspension method, an emulsification method, and a dispersion polymerization method.

The core 111 including the metal material may include, for example, pure copper (Cu), nickel (Ni), aluminum (Al), or an alloy thereof, without being limited thereto.

Although the core 111 having a spherical shape is illustrated, the core 111 may have various shapes, such as a cylindrical shape, a square pillar shape, a polygonal pillar shape, a conical shape, and a pyramid shape.

A first metal layer 113 may be provided on the core 111. The first metal layer 113 may be formed directly on the core 111 or formed on the core 111 by interposing another material layer therebetween.

Although components of the first metal layer 113 are not specifically limited, a metal, such as gold (Au), silver (Ag), nickel (Ni), zinc (Zn), tin (Sn), aluminum (Al), chromium (Cr), cobalt (Co), and antimony (Sb), may be used. The components of the first metal layer 113 may be used alone or in combination of at least two thereof. The first metal layer 113 may be formed using a method, such as a plating process, a physical vapor deposition (PVD) process, and a chemical vapor deposition (CVD) process. In particular, when the first metal layer 113 is formed using a plating process, the first metal layer 113 may be formed by an electroplating process using nickel (Ni) or an electroless process.

The first metal layer 113 may be formed using a brightener to improve a roughness of a surface of the first metal layer 113. That is, the first metal layer 113 having a relatively smooth surface may be obtained by using the brightener. The brightener may include, for example, an oxygen-containing organic compound (e.g., a polyether-based compound); a nitrogen-containing organic compound (e.g., a tertiary amine compound and a quaternary ammonium compound); and/or a sulfur-containing organic compound having a sulfonate group, without being limited thereto.

The first metal layer 113 may have a thickness of about 1 µm to about 5 µm. The first metal layer 113 may be reacted with tin (Sn)-based solder paste to form, for example, an intermetallic compound, such as (Ni,Cu)$_3$Sn$_4$, (Cu,Ni)$_6$Sn$_5$, and Ni$_3$Sn$_4$.

A second metal layer 115 may be formed on a surface of the first metal layer 113. The second metal layer 115 may have a thickness of about 0.01 µm to about 0.3 µm. When the second metal layer 111 has an excessively small thickness, a solder layer may not be formed over an entire surface of the core material 110 for reverse reflow when the core material 110 for reverse reflow is subsequently used for a reflow process. When the second metal layer 115 has an excessively great thickness, economical efficiency may be adversely affected, and the second metal layer 115 may react with tin-based solder during a subsequent reflow process to form an intermetallic compound (e.g., AuSn$_4$) having a low strength.

The second metal layer 115 may include, for example, gold (Au), platinum (Pt), or an alloy thereof. The second metal layer 115 may be easily mixed with the solder layer due to heating. In addition, because the second metal layer 115 includes a metal having an oxidation resistance, the second metal layer 115 may suppress the oxidation of a surface of the core material 110 for reverse reflow.

The second metal layer 115 may be formed using a method, such as an electroplating process, an electroless process, a PVD process, and a CVD process, without being limited thereto.

The core material 110 for reverse reflow may not be used solely as a solder bump but form a portion of a semiconductor interconnection by undergoing a reflow process together with the solder member (refer to 120 in FIG. 2), as will be described in detail below.

Figure 2:
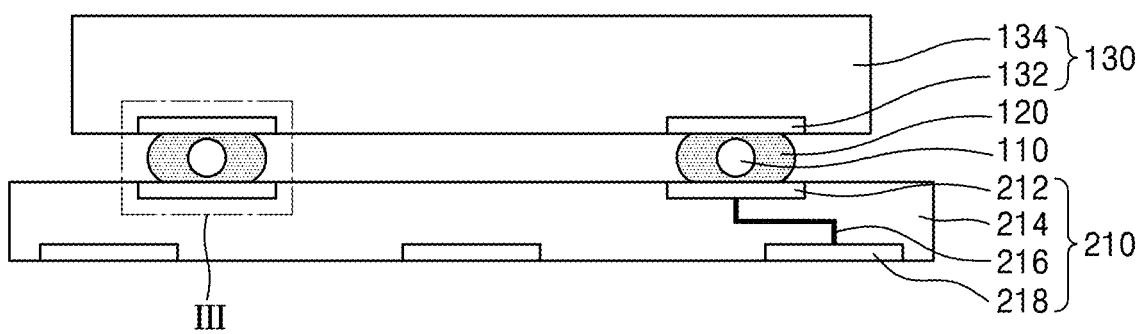
FIG. 2 is a cross-sectional view of a semiconductor package using a core material for reverse reflow, according to an embodiment.

FIG. 2 is a cross-sectional view of a semiconductor package 10 using a core material for reverse reflow, according to an embodiment.

Referring to FIG. 2, the semiconductor package 10 may include a core material 110 for reverse reflow and a solder member 120, which serve as a semiconductor interconnection.

In the core material 110 for reverse reflow, for example, a core 111 may have a diameter of about 21 µm to about 500 µm, a first metal layer 113 may have a thickness of about 1 µm to about 5 µm, and a second metal layer 115 may have a thickness of about 0.01 µm to about 0.3 µm. However, the diameter of the core material 110 for reverse reflow is not limited thereto. Because the core material 110 for reverse reflow has been described above in detail with reference to FIG. 1, an additional description thereof is omitted.

The solder member 120 may refer to a solder layer surrounding the core material 110 for reverse reflow. Conductive metal powder used for the solder member 120 may include, for example, at least one selected from tin (Sn), gold (Au), silver (Ag), platinum (Pt), copper (Cu), bismuth (Bi), palladium (Pd), chromium (Cr), calcium (Ca), nickel (Ni), germanium (Ge), zinc (Zn), manganese (Mn), cobalt (Co), tungsten (W), antimony (Sb), lead (Pb), and an alloy thereof.

In some embodiments, the solder member 120 may include a lead-containing solder alloy (e.g., a Sn—Pb-based alloy or a Sn—Pb—Ag-based alloy) or a lead-free solder alloy (e.g., a Sn—Ag-based alloy, a Sn—Bi-based alloy, a Sn—Zn-based alloy, a Sn—Sb-based alloy, or a Sn—Ag—Cu alloy). The solder member 120 may include at least 50%, at least 60%, or at least 90% by weight of Sn, based on a total metal weight. When the metal powder includes at least two metal components, the metal powder may be formed using an alloy of the at least two metal components. When the metal powder is obtained using the alloy, the metal powder may not substantially include an organic material.

The solder member 120 may include a mixture in which conductive metal powder is mixed with a liquid flux. The flux may be prepared by mixing respective components, such as a solvent, a rosin, a thixotropic agent, and an activator.

Specifically, the solvent may include an organic solvent having a boiling point of about 180° C. or higher, such as diethylene glycol monohexyl ether, diethylene glycol monobutyl ether, diethylene glycol monobutyl ether acetate, tetraethylene glycol, 2-ethyl-1,3-hexanediol, and α-terpineol. In addition, the rosin may include a gum rosin, a hydrogenated rosin, a polymerized rosin, and an ester rosin. In addition, the thixotropic agent may include hydrogenated castor oil, fatty acid amide, natural fat, synthetic fat, N, N'-ethylenebis-12-hydroxystearylamide, 12-hydroxystearic acid, 1,2,3,4-dibenzylidene-D-sorbitol, and derivatives thereof. Furthermore, the activator may include a hydrohalic acid amine salt. However, the solvent, the rosin, the thixotropic agent, and the activator are not limited to the above-described examples.

A dotted amount of the solder member 120 may be appropriately selected by a person skilled in the art considering a viscosity of the solder member 120, sizes of a first bump pad 132 and a second bump pad 212, and a size of the core material 110 for reverse reflow, which is to be located in the solder member 120.

The core material 110 for reverse reflow and the solder member 120 may be on the first bump pad 132 of the semiconductor device 130. The semiconductor device 130 may include a first substrate 134 on which the first bump pad 132 is located, and semiconductor elements (not shown) formed on the first substrate 134.

In some embodiments, a wafer-level package (WLP) structure or a panel-level package (PLP) structure may be applied to the semiconductor device 130.

The first substrate 134 may include an active surface on which semiconductor elements are located and an inactive surface opposite to the active surface.

The first substrate 134 may include a semiconductor substrate, specifically, a silicon (Si) substrate. In addition, the first substrate 134 may include a semiconductor element, such as germanium (Ge); or a compound semiconductor, such as silicon carbide (SiC), gallium arsenide (GaAs), indium arsenide (InAs), and indium phosphide (InP).

The first substrate 134 may have a silicon-on-insulator (SOI) structure. For example, the first substrate 134 may include a buried oxide layer (BOX) layer. In some embodiments, the first substrate 134 may include a conductive region (e.g., a doped well or a doped structure). In addition, the first substrate 134 may have various isolation structures, such as a shallow trench isolation (STI) structure.

Various semiconductor elements may be provided on the active surface of the first substrate 134. The semiconductor elements may include a memory device, a core circuit element, a peripheral circuit element, a logic circuit element, or a control circuit element. The memory device may include a volatile semiconductor memory device (e.g., dynamic random access memory (DRAM) and static RAM (SRAM)); and a non-volatile memory device (e.g., flash memory, phase-change RAM (PRAM), resistive RAM (RRAM), ferroelectric RAM (FRAM), magnetic RAM (MRAM), erasable programmable read-only memory (EPROM), electrically erasable PROM (EEPROM), and flash EEPROM).

In addition, a system large-scale integration (LSI) device, an image sensor, a micro-electro-mechanical systems (MEMS) device, an active element, and a passive element may be provided on the active surface of the first substrate 134.

Furthermore, a wiring layer may be provided on the semiconductor elements on the active surface of the first substrate 134. The wiring layer may include a wiring pattern and an insulating layer. In addition, the wiring pattern may be electrically connected to the first bump pad 132, which is an electrode terminal.

In some embodiments, the semiconductor device 130 may further include an encapsulant configured to encapsulate the semiconductor elements. The encapsulant may include, for example, an epoxy molding compound (EMC).

The core material 110 for reverse reflow and the solder member 120 may be on the second bump pad 212 of the module device 210. The module device 210 may include a second substrate 214, the second bump pad 212 formed on a top surface of the second substrate 214, and an external connection pad formed on a bottom surface of the second substrate 214.

Unlike the first substrate 134, the second substrate 214 may include a printed circuit board (PCB). For example, the second substrate 214 may include a rigid PCB, a flexible PCB, a tape substrate, or a rigid-flexible PCB. In other embodiments, the second substrate 214 may include the same semiconductor substrate as the first substrate 134.

When the second substrate 214 includes the PCB, the second substrate 214 may include a first resin layer and a second resin layer, which are respectively on a top surface and a bottom surface of a body included in the PCB. Each of the first resin layer and the second resin layer may have a multilayered structure. A signal layer, a ground layer, or a power layer may be interposed between the multilayered structures and connected to the wiring pattern 216. In addition, the wiring pattern 216 may electrically connect the second bump pad 212 to the external connection pad 218.

The first resin layer and the second resin layer may include, for example, an epoxy resin, a urethane resin, a polyimide resin, an acryl resin, a polyolefin resin, or the like.

The second bump pad 212 may include a conductive pad, for example, a metal pad. More specifically, the second bump pad 212 may include, for example, a copper (Cu) pad, a nickel (Ni) pad, or a nickel-plated aluminum (Al) pad, without being limited thereto.

The core material 110 for reverse reflow and the solder member 120 will be examined again. The solder member 120 may be at a constant height between the first bump pad 132 and the second bump pad 212. To form the solder layer surrounding the core material 110 for reverse reflow, the solder member 120 may be reflowed.

When a temperature of the solder member 120 is increased, a material included in the solder member 120 may be melted, and thus, a surface of the core material 110 for reverse reflow may be coated with the material. Specifically, the solder member 120 may be melted and moves along a sidewall of the core material 110 for reverse reflow. As a result, the solder member 120 may cover an entire surface of the core material 110 for reverse reflow.

In some embodiments, even when the solder member 120 is located below the core material 110 for reverse reflow, the molten solder member 120 may move upward along the surface of the core material 110 for reverse reflow against the direction of gravity. Because a viscosity of the molten solder member 120 is considerably reduced, the core material 110 for reverse reflow may move closer to the first substrate 134 than when first located on the solder member 120 that is not melted.

Although not limited by any specific theory, it may be inferred that the solder member 120 moves upward against gravity due to the movement of the core material 110 for reverse reflow, surface tension of the surface of the core material 110 for reverse reflow, and affinity between the second metal layer 115 forming the surface of the core material 110 for reverse reflow and the solder member 120.

Accordingly, a semiconductor interconnection having the solder layer may be formed between the first bump pad 132 and the second bump pad 212.

In a solder ball (e.g., a coper core solder ball (CCSB)) using a copper core material according to the related art, a solder layer plated around the copper core material may be melted to enable the bonding of a stacked semiconductor package. In the semiconductor package, a height of the solder layer may be maintained due to the unmolten copper core material. However, when the stacked semiconductor package in which a bump pad has a great size and a height of the solder layer should be maintained low uses the CCSB, a very thick solder layer may be required. In addition, when a size of the copper core material is reduced to about 100 μm or less, a weight of the copper core material may become about 4.7 μg or less, and thus, an electroplating process may be precluded.

To solve the above-described problems, according to an embodiment, a gap height between the stacked semiconductor package and/or the PCB may be maintained constant by using the core material 110 for reverse reflow and the solder member 120. Accordingly, the semiconductor package 10 having an excellent bonding strength and a low failure rate may be economically provided.

Figure 3:
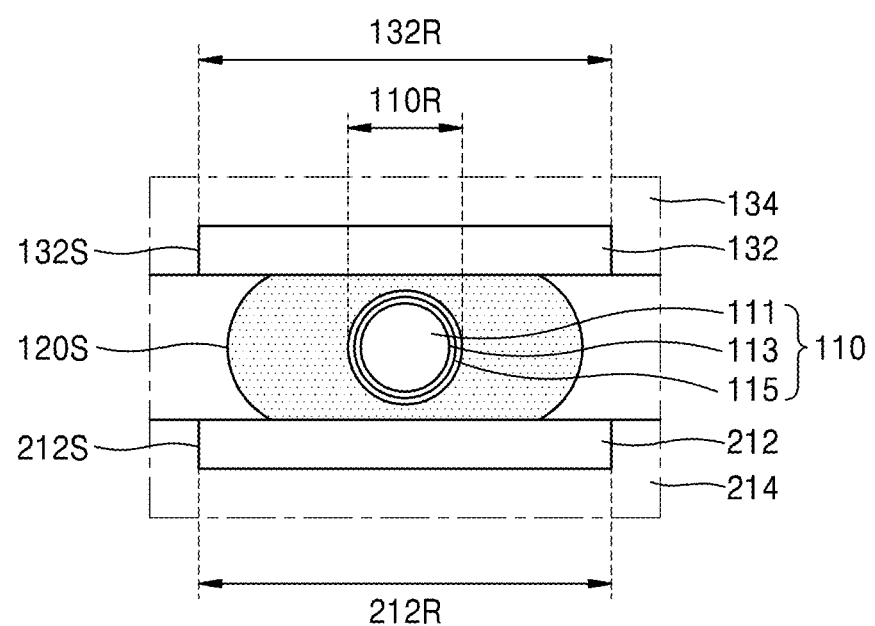
FIG. 3 is a partial enlarged view of portion III of FIG. 2.

FIG. 3 is a partial enlarged view of portion III of FIG. 2.

Referring to FIG. 3, the solder member 120 may be formed on a surface of the coating material 110 for reverse reflow.

The core 111 and the first metal layer 113 of the core material 110 for reverse reflow may be the same as those described above with reference to FIG. 1. Meanwhile, the second metal layer 115 may form an alloy with the solder member 120 during the formation of a solder layer.

In some embodiments, the second metal layer 115 may form an alloy with the solder member 120 to a partial thickness thereof. When the second metal layer 115 forms the alloy with the solder member 120, the concentration of a component included in the second metal layer 115 may be gradually reduced in a direction away from a surface of the core 111.

In other embodiments, because the second metal layer 115 has a small thickness of about 0.1 μm to about 0.3 μm, the second metal layer 115 may be entirely melted by heating and form the alloy with the solder member 120. Although not shown, the second metal layer 115 may entirely form an alloy and/or an intermetallic compound with the solder member 120, without being limited thereto.

Alternatively, the first metal layer 113 may partially or entirely form the intermetallic compound with the solder member 120 to form an interface layer. Alternatively, the intermetallic compound may include a component of the core 111. In particular, when the first metal layer 113 entirely forms the intermetallic compound with the solder member 120, the first metal layer 113 may not present but the interface layer may be directly present on the surface of the core 111.

Here, the intermetallic compound may be, for example, at least one selected from the group consisting of $(Ni,Cu)_3Sn_4$, $(Cu,Ni)_6Sn_5$, and $Ni_3Sn_4$, another intermetallic compound may be formed according to materials included in the core 111, the first metal layer 113, the second metal layer 115, and the solder member 120. An intermetallic compound of a component derived from the first metal layer 113 and a component derived from the solder member 120 may be in the interface layer. Alternatively, an alloy of a component derived from the second metal layer 115 and a component derived from the solder member 120 may be in the interface layer.

By mixing the solder member 120 with the second metal layer 115 at a side surface of the core material 110 for reverse reflow, wetting may be further improved as compared to a case in which the second metal layer 115 is not formed.

A first diameter 132R of the first bump pad 132 may be at least about 1.1 times greater than a third diameter 110R of the core material 110 for reverse reflow. Also, a second diameter 212R of the second bump pad 212 may be at least about 1.1 times greater than the third diameter 110R of the core material 110 for reverse reflow. That is, the first bump pad 132 and the second bump pad 212, each of which has a greater size than the core material 110 for reverse reflow, may be provided.

Both side surfaces 120S of the solder member 120 may be curved surfaces. The side surfaces 120S of the solder member 120 may be formed not to protrude outward from both side surfaces 132S of the first bump pad 132 and both side surfaces 212S of the second bump pad 212. Thus, a defect caused by contact between the solder members 120 of adjacent semiconductor interconnections may be prevented in advance.

Figure 4:
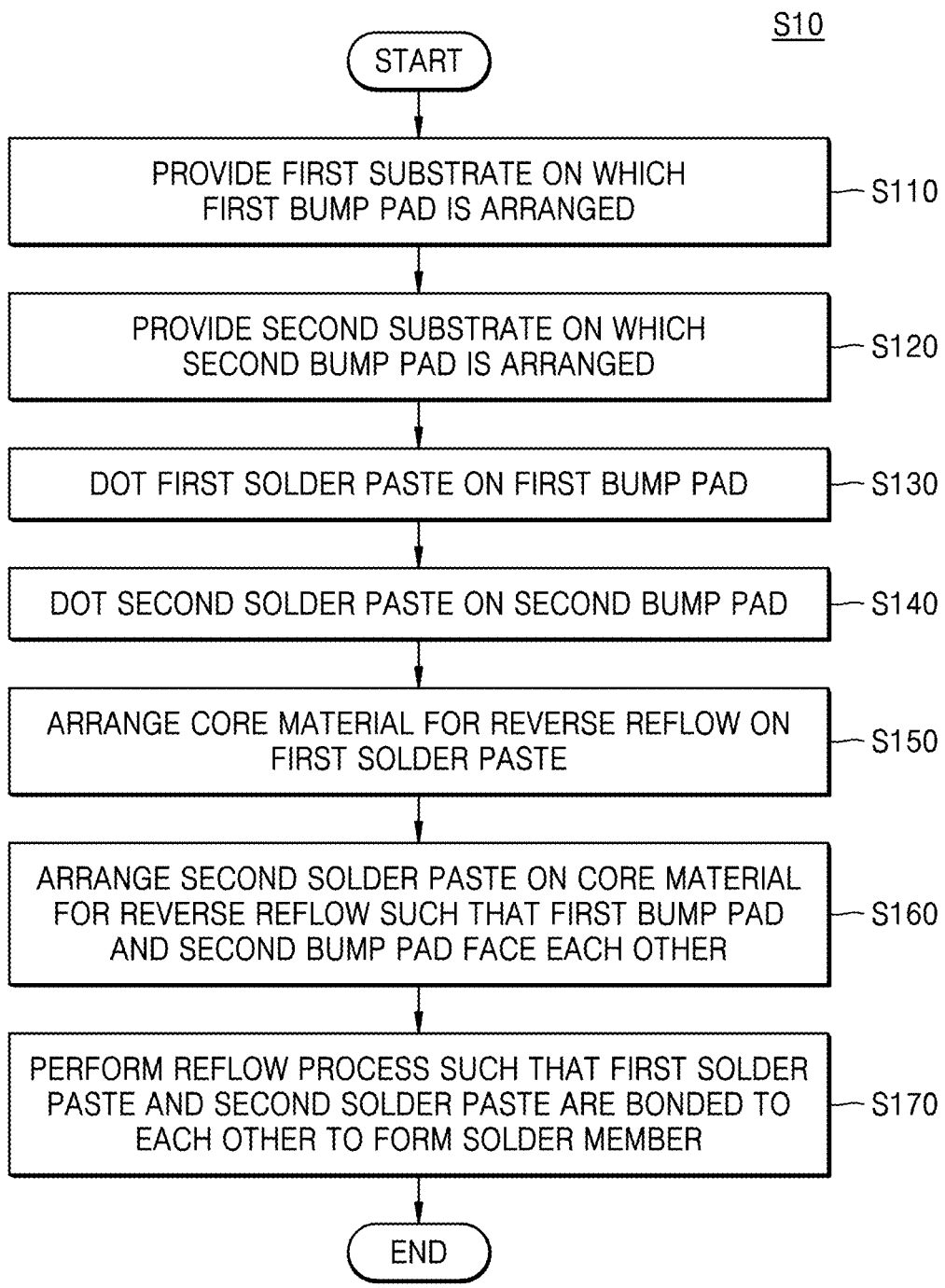
FIG. 4 is a flowchart of a method of manufacturing a semiconductor package, according to an embodiment.

FIG. 4 is a flowchart of a method S10 of manufacturing a semiconductor package, according to an embodiment.

The method S10 of manufacturing the semiconductor package, according to the embodiment, may include a process sequence described below. When some embodiments may be embodied otherwise, respective process operations described herein may be performed otherwise. For example, two process operations described in a sequential order may be performed substantially at the same time or in reverse order.

Referring to FIG. 4, the method S10 of manufacturing the semiconductor package may include a first operation S110 of providing a first substrate on which a first bump pad is located, a second operation S120 of providing a second substrate on which a second bump pad is located, a third operation S130 of dotting first solder paste on the first bump pad, a fourth operation S140 of dotting second solder paste on the second bump pad, a fifth operation S150 of locating a core material for reverse reflow on the first solder paste, a sixth operation S160 of locating second solder paste on the core material for reverse reflow such that the first bump pad and the second bump pad face each other, and a seventh operation S170 of performing a reflow process such that the first solder paste and the second solder paste are bonded to each other to form a solder member.

Technical characteristics of each of first to seventh operations S110 to S170 will be described below in detail with reference to FIGS. 5A to 5D.

FIGS. 5A to 5D are cross-sectional views of a process sequence of a method of manufacturing a semiconductor package, according to an embodiment.

Figure 5A:
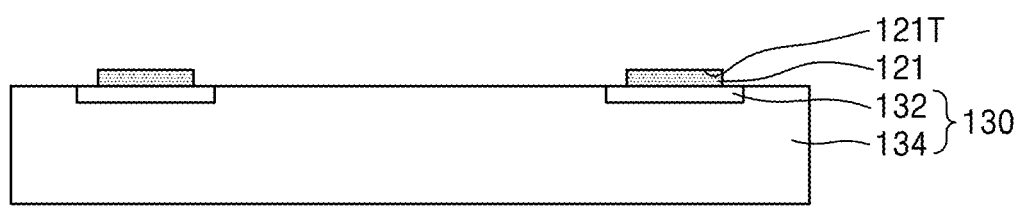
FIGS. 5A to 5D are cross-sectional views of a process sequence a method of manufacturing a semiconductor package, according to an embodiment.

Referring to FIG. 5A, a semiconductor device 130 having a first bump pad 132 may be provided, and first solder paste 121 may be dotted on the first bump pad 132.

The semiconductor device 130 may include a first substrate 134, a first bump pad 132 formed on a surface of the first substrate 134, and semiconductor elements on the first substrate 134.

The first solder paste 121 may include a mixture in which conductive metal powder is mixed with a liquid flux. A top surface 121T of the first solder paste 121 may be planar. Also, first solder paste 121 may be dotted on the first bump pad 132 such that a width of the first solder paste 121 is less than a width of the first bump pad 132.

Figure 5B:
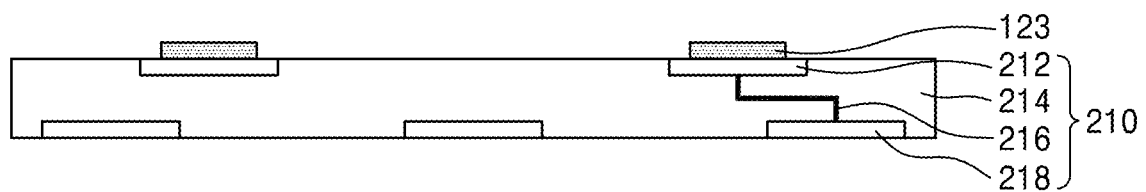

Referring to FIG. 5B, a module device 210 having a second bump pad 212 may be provided, and second solder paste 123 may be dotted on the second bump pad 212.

The module device 210 may include a second substrate 214, a second bump pad 212 formed on a top surface of the second substrate 214, and an external connection pad 218 formed on a bottom surface of the second substrate 214.

Similar to the first solder paste (refer to 121 in FIG. 5A) described above, the second solder paste 123 may include a mixture in which conductive metal powder is mixed with a liquid flux. A top surface of the second solder paste 123 may be planar. Also, second solder paste 123 may be dotted on the second bump pad 212 such that a width of the second solder paste 123 is less than a width of the second bump pad 212.

Figure 5C:
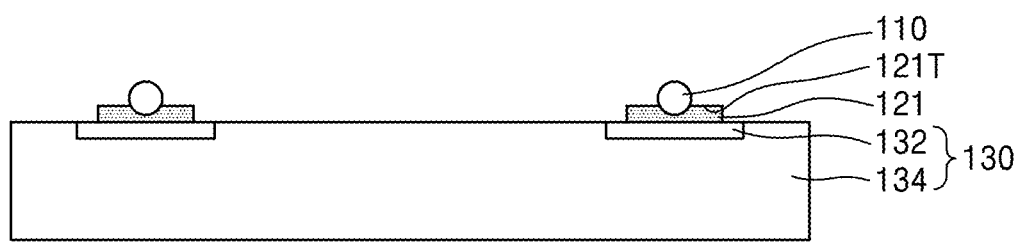

Referring to FIG. 5C, a core material 110 for reverse reflow may be on the top surface 121T of the first solder paste 121.

In the core material 110 for reverse reflow, for example, a core 111 may have a diameter of about 21 µm to about 500 µm, a first metal layer 113 may have a thickness of about 1 µm to about 5 µm, and a second metal layer 115 may have a thickness of about 0.01 µm to about 0.3 µm. However, the diameter of the core material 110 for reverse reflow is not limited thereto.

Due to the weight of the core material 110 for reverse reflow, a part of the core material 110 for reverse reflow may be immersed in the first solder paste 121.

Figure 5D:
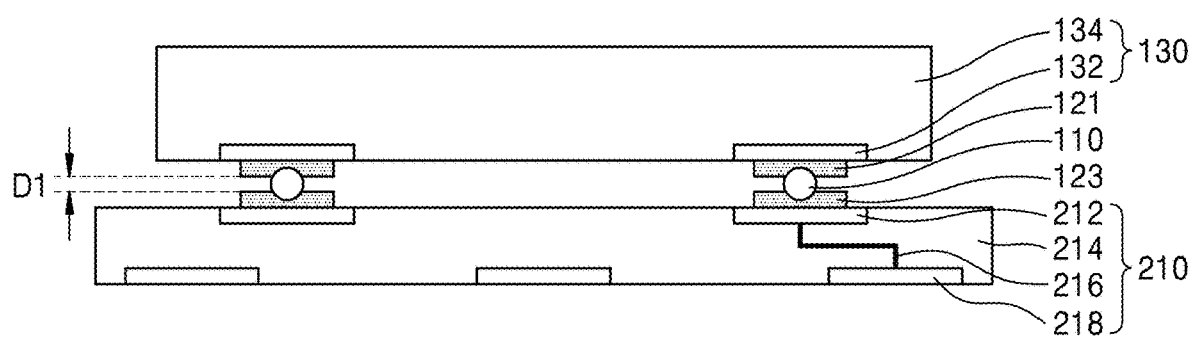

Referring to FIG. 5D, the semiconductor device 130 may be on the module device 210 with the core material 110 for reverse reflow therebetween.

Specifically, the semiconductor device 130 may be on the module device 210 such that the first bump pad 132 and the second bump pad 212 face each other, namely, such that the second solder paste 123 is on the core material 110 for reverse reflow.

Here, the first solder paste 121 and the second solder paste 123 may be a predetermined distance D1 apart from each other. That is, before a reflow process is performed, the first solder paste 121 and the second solder paste 123 may be located with the core material 110 for reverse reflow therebetween.

Referring to FIG. 2 again, a reflow process for bonding the first solder paste 121 and the second solder paste 123 to each other may be performed to form a solder member 120 covering the core material 110 for reverse reflow.

When temperatures of the first solder paste 121 and the second solder paste 123 are increased, the first solder paste 121 and the second solder paste 123 may be melted, and thus, a surface of the core material 110 for reverse reflow may be completely coated with the first and second solder paste 121 and 123.

The reflow process may be performed at a temperature of about 200° C. to about 300° C. Also, the reflow process may be performed for about 20 seconds to about 100 seconds, without being limited thereto.

As described above, in the method of manufacturing the semiconductor package according to the embodiment, the solder member 120 in which a predetermined gap is maintained by the core material 110 for reverse reflow may be formed between the first bump pad 132 and the second bump pad 212 by using surface mounting technology (SMT) in the semiconductor package 10. Accordingly, a semiconductor interconnection having an excellent bonding strength and a low failure rate may be provided.

Figure 6:
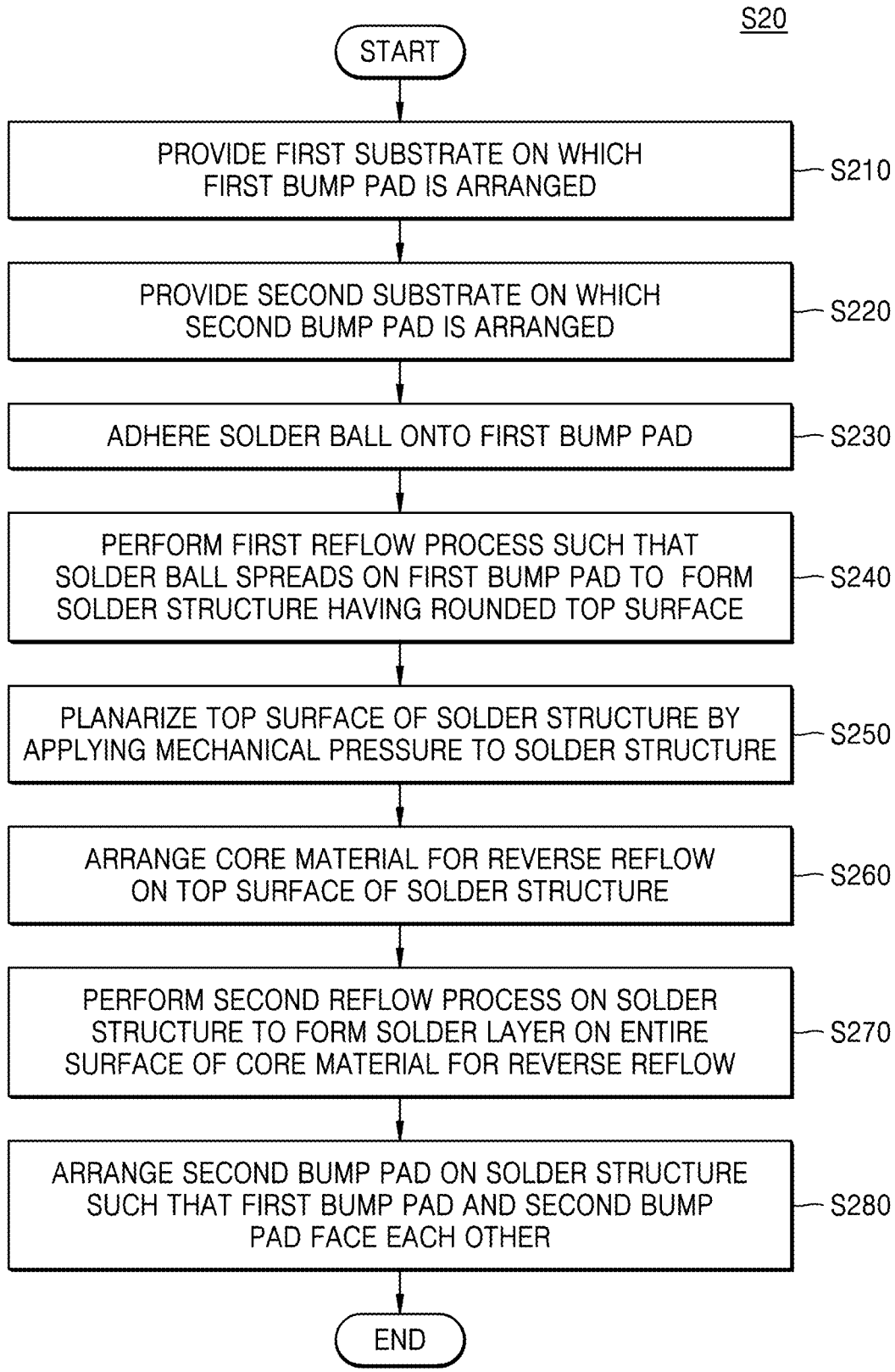
FIG. 6 is a flowchart of a method of manufacturing a semiconductor package, according to an embodiment.

FIG. 6 is a flowchart of a method S20 of manufacturing a semiconductor package, according to an embodiment.

The method S20 of manufacturing the semiconductor package, according to the embodiment, may include a process sequence described below. When some embodiments may be embodied otherwise, respective process operations described herein may be performed otherwise. For example, two process operations described in a sequential order may be performed substantially at the same time or in reverse order.

Referring to FIG. 6, the method S20 of manufacturing the semiconductor package may include a first operation S210 of providing a first substrate on which a first bump pad is located, a second operation S220 of providing a second substrate on which a second bump pad is located, a third operation S230 of adhering a solder ball onto the first bump pad, a fourth operation S240 of performing a first reflow process such that the solder ball spreads on the first bump pad to form a solder structure having a rounded top surface, a fifth operation S250 of planarizing the top surface of the solder structure by applying a mechanical pressure to the solder structure, a sixth operation S260 of locating a core material for reverse reflow on the top surface of the solder structure, a seventh operation S270 of performing a second reflow process on the solder structure to form a solder layer on an entire surface of the core material for reverse reflow, and an eighth operation S280 of locating a second bump pad on the solder structure such that the first bump pad and the second bump pad face each other.

Technical characteristics of each of the first to eighth operations S210 to S280 will be described below in detail with reference to FIGS. 7A to 7E.

FIGS. 7A to 7E are cross-sectional views of a process sequence of a method of manufacturing a semiconductor package, according to an embodiment.

Figure 7A:
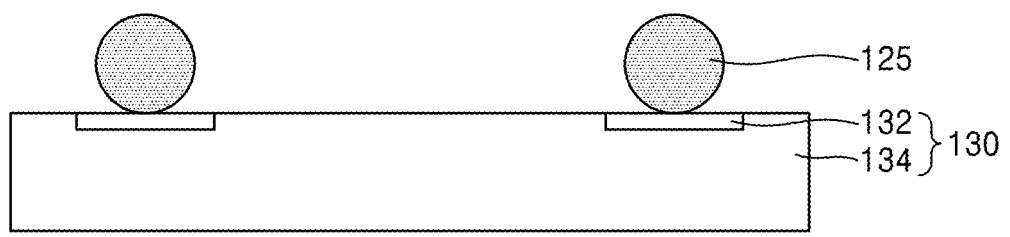
FIGS. 7A to 7E are cross-sectional views of a process sequence of a method of manufacturing a semiconductor package, according to an embodiment.

Referring to FIG. 7A, a semiconductor device 130 having a first bump pad 132 may be provided, and a solder ball 125 may be adhered onto the first bump pad 132.

A material used for the solder ball 125 may include, for example, at least one selected from tin (Sn), gold (Au), silver (Ag), platinum (Pt), copper (Cu), bismuth (Bi), palladium (Pd), chromium (Cr), calcium (Ca), nickel (Ni), germanium (Ge), zinc (Zn), manganese (Mn), cobalt (Co), tungsten (W), antimony (Sb), lead (Pb), and an alloy thereof.

In addition, the solder ball 125 having a width less than that of the first bump pad 132 may be adhered onto the first bump pad 132.

Figure 7B:
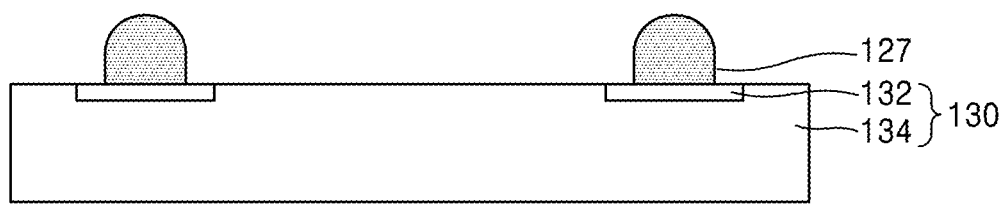

Referring to FIG. 7B, a first reflow process may be performed such that the solder ball (refer to 125 in FIG. 7A) spreads on the first bump pad 132 to form a solder structure 127 having a rounded top surface.

The first reflow process may be performed at a temperature of about 200° C. to about 300° C. Also, the first reflow process may be performed for about 20 seconds to about 100 seconds.

The solder structure 127 of which the top surface is rounded may be located to cover a portion of a top surface of the first bump pad 132. Because the solder structure 127 is a modified form of the solder ball 125, the solder structure 127 may have the same mass and volume as the solder ball 125.

Figure 7C:
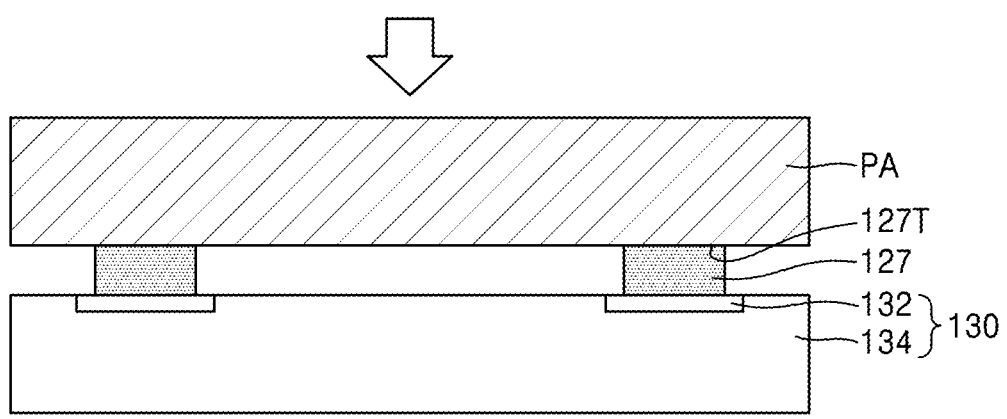

Referring to FIG. 7C, the top surface of the solder structure 127 may be planarized by applying a mechanical pressure to the solder structure 127.

The mechanical pressure may be applied to the solder structure 127 by using a pressure apparatus PA. Because a bottom surface of the pressure apparatus PA is planar, a top surface 127T of the solder structure 127 may be planarly formed. Accordingly, the solder structure 127 may be located to further spread on the first bump pad 132.

Specifically, at least one pressure apparatus PA may be provided. The pressure apparatus PA may be connected to a robot arm. The pressure apparatus PA may include a pressing plate and a pressing rod connected to the pressing plate. The pressing plate may be in contact with the top surface 127T of the solder structure 127 and directly apply a pressure to the top surface 127T of the solder structure 127. The pressing rod may move up and down and apply the pressure to the solder structure 127 through the pressing plate.

Figure 7D:
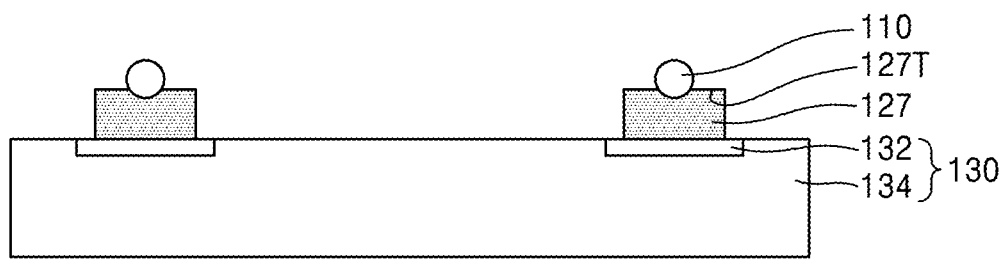

Referring to FIG. 7D, a core material 110 for reverse reflow may be on the top surface 127T of the solder structure 127.

In the core material 110 for reverse reflow, for example, a core 111 may have a diameter of about 21 μm to about 500 μm, a first metal layer 113 may have a thickness of about 1 μm to about 5 μm, and a second metal layer 115 may have a thickness of about 0.01 μm to about 0.3 μm. However, the diameter of the core material 110 for reverse reflow is not limited thereto.

Due to the weight of the core material 110 for reverse reflow, a part of the core material 110 for reverse reflow may be partially immersed in the solder structure 127.

Figure 7E:
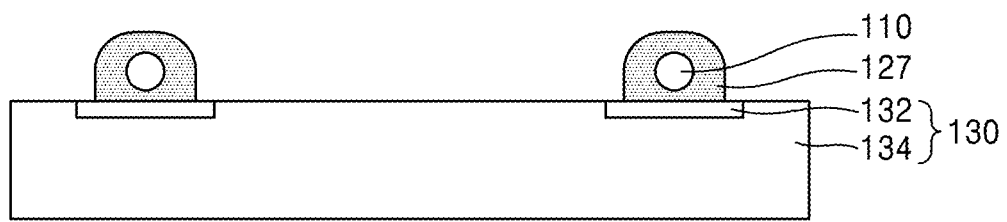

Referring to FIG. 7E, a second reflow process may be performed on the solder structure 127 to form a solder layer on an entire surface of the core material 110 for reverse reflow.

When a temperature of the solder structure 127 is increased, the solder structure 127 may be melted, and thus, a surface of the core material 110 for reverse reflow may be coated with the solder structure 127. Specifically, the solder structure 127 may be melted and moves along a sidewall of the core material 110 for reverse reflow. As a result, the solder structure 127 may cover an entire surface of the core material 110 for reverse reflow.

Even when the solder structure 127 is located below the core material 110 for reverse reflow, the molten solder structure 127 may move upward along the surface of the core material 110 for reverse reflow against the direction of gravity. In this case, because a viscosity of the molten solder structure 127 is considerably reduced, the core material 110 for reverse reflow may move closer to the first substrate 134 than when first located on the solder structure 127 that is not melted. It may be inferred that the solder structure 127 moves upward against gravity due to the movement of the core material 110 for reverse reflow, surface tension of the surface of the core material 110 for reverse reflow, and affinity between the second metal layer 115 forming the surface of the core material 110 for reverse reflow and the solder structure 127.

The second reflow process may be performed at a temperature of about 200° C. to about 300° C. In addition, the second reflow process may be performed for about 20 seconds to about 100 seconds. The second reflow process and the first reflow process may be performed at the same temperature for the same period of time or performed at different temperatures for different periods of time.

Referring to FIG. 2 again, the semiconductor device 130 may be on the module device 210 with the core material 110 for reverse reflow therebetween. The solder structure 127 may be transformed into a solder member 120 by pressure.

Specifically, the semiconductor device 130 may be on the module device 210 such that the first bump pad 132 and the second bump pad 212 face each other, namely, such that the core material 110 for reverse reflow is completely surrounded by the solder member 120.

As described above, in the method of manufacturing the semiconductor package according to the embodiment, the solder member 120 in which a predetermined gap is maintained by the core material 110 for reverse reflow may be formed between the first bump pad 132 and the second bump pad 212 by using SMT in the semiconductor package 10. Accordingly, a semiconductor interconnection having an excellent bonding strength and a low failure rate may be provided.

Figure 8:
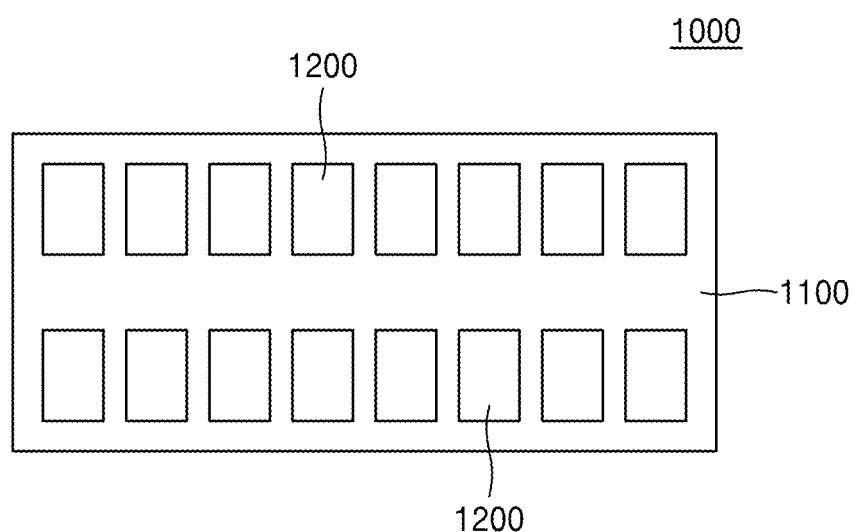
FIG. 8 is a plan view of a memory module including a semiconductor package, according to an embodiment.

FIG. 8 is a plan view of a memory module 1000 including a semiconductor package, according to an embodiment.

Referring to FIG. 8, the memory module 1000 may include a PCB 1100 and a plurality of semiconductor packages 1200.

Each of the semiconductor packages 1200 may correspond to or include the semiconductor package 10 described above with reference to FIG. 2.

The memory module 1000 may be a single in-line memory module (SIMM) in which the plurality of semiconductor packages 1200 are mounted on only one surface of the PCB 1100 or a dual in-line memory module (DIMM) in which the plurality of semiconductor packages 1200 are mounted on both surfaces of the PCB 1100. In addition, the memory module 1000 may be a fully buffered DIMM (FBDIMM) having an advanced memory buffer (AMB) configured to respectively provide signals to the plurality of semiconductor packages 1200 from the outside.

Figure 9:
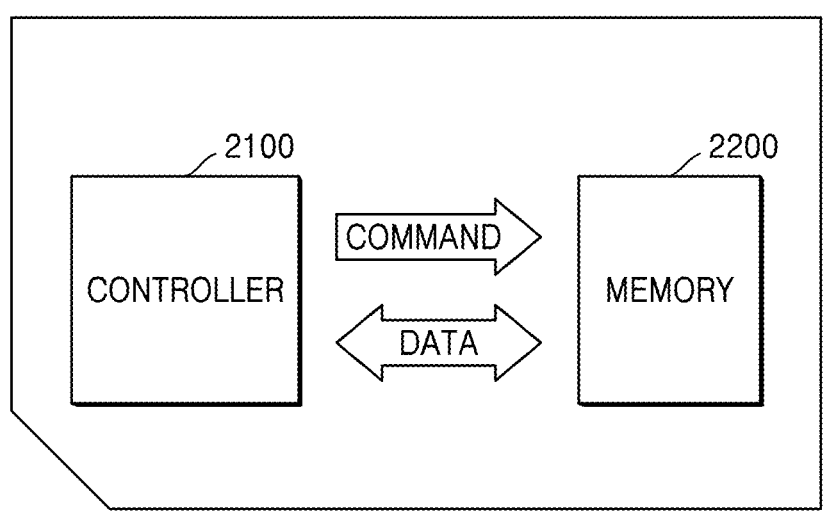
FIG. 9 is a schematic view of a memory card including a semiconductor package, according to an embodiment.

FIG. 9 is a schematic view of a memory card 2000 including a semiconductor package, according to an embodiment.

Referring to FIG. 9, a controller 2100 and a memory 2200 may be in the memory card 2000 to exchange electric signals.

The memory 2200 may correspond to or include the semiconductor package 10 described above with reference to FIG. 2.

The memory card 2000 may constitute various kinds of cards, for example, various memory cards, such as a memory stick card, a smart media (SM) card, a secure digital (SD) card, a mini-SD card, and a multimedia card.

Figure 10:
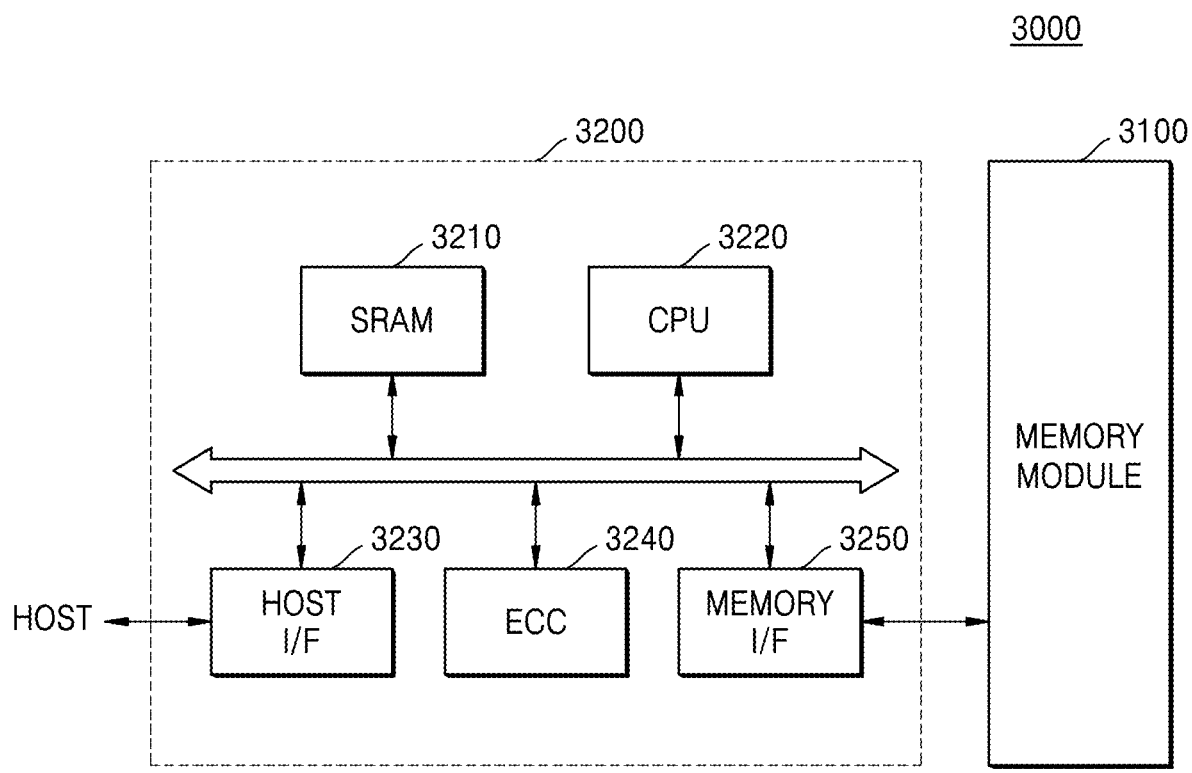
FIG. 10 is a block diagram of a memory device including a semiconductor package, according to an embodiment.

FIG. 10 is a block diagram of a memory device 3000 including a semiconductor package, according to an embodiment.

Referring to FIG. 10, the memory device 3000 may include a memory module 3100 and a memory controller 3200.

The memory module 3100 may correspond to or include the semiconductor package 10 described above with reference to FIG. 2. The memory device 3000 may include a memory controller 3200 configured to control data exchange between a host Host and the memory module 3100.

The memory controller 3200 may include a central processing unit (CPU) 3220 configured to control all operations of a memory card. In addition, the memory controller 3200 may include SRAM, which is used as an operating memory of the CPU 3220. Furthermore, the memory controller 3200 may further include a host interface (I/F) 3230 and a memory IF 3250.

The host IF 3230 may include a data exchange protocol between the memory device 3000 and the host Host. The memory IF 3250 may connect the memory controller 3200 to the memory module 3100. Furthermore, the memory controller 3200 may further include an error correction code (ECC) 3240. The ECC 3240 may detect and correct an error in data read from the memory module 3100.

Although not shown, the memory device 3000 may further include a ROM device configured to store code data required for interfacing with the host Host. The memory device 3000 may be implemented as a solid-state drive (SSD) that may replace a hard disk of a computer system.

Figure 11:
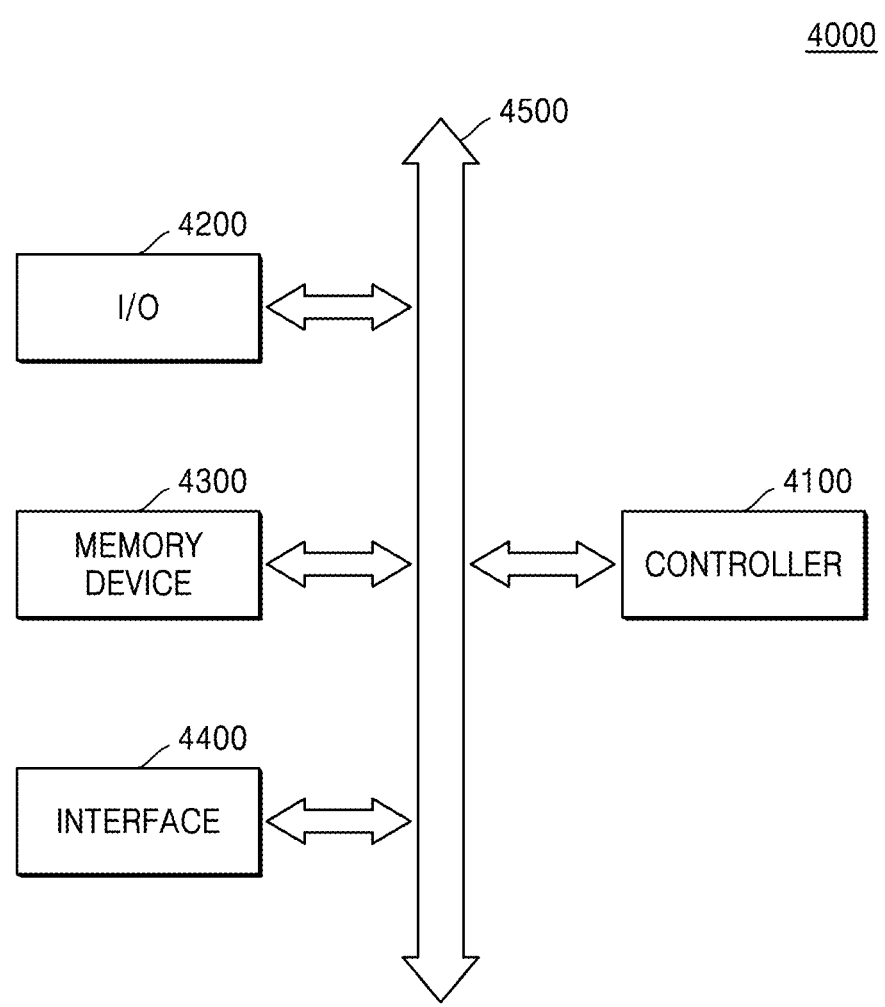
FIG. 11 is a block diagram of an electronic system including a semiconductor package, according to an embodiment.

FIG. 11 is a block diagram of an electronic system 400 including a semiconductor package, according to an embodiment.

Referring to FIG. 11, the electronic system 4000 may include a controller 4100, an input/output (I/O) device 4200, a memory device 4300, an interface 4400, and a bus 4500.

The controller 4100, the I/O device 4200, the memory device 4300, and/or the interface 4400 may be combined with each other via a bus 4500. The bus 4500 may correspond to a path through which data is moved.

The controller 4100 may include at least one of a microprocessor, a digital signal processor, a microcontroller, and local elements capable of performing similar functions thereto.

The I/O device 4200 may include a keypad, a keyboard, a touch pad, or a display device.

The memory device 4300 may store data and/or commands. The memory device 4300 may correspond to or include the semiconductor package 10 described above with reference to FIG. 2.

The interface 4400 may transmit data to a communication network or receive data from the communication network. The interface 4400 may be a wired type or a wireless type. For example, the interface 4400 may include an antenna or a wired/wireless transceiver.

Although not shown, the electronic system 4000 may further include high-speed DRAM device and/or SRAM device as an operating memory device for improving operations of the controller 4100.

The electronic system 4000 may be applied to all electronic products capable of transmitting and receiving information in the wireless environment, for example, personal digital assistants (PDAs), portable computers, tablets, wireless phones, mobile phones, digital music players, and memory cards.

Figure 12:
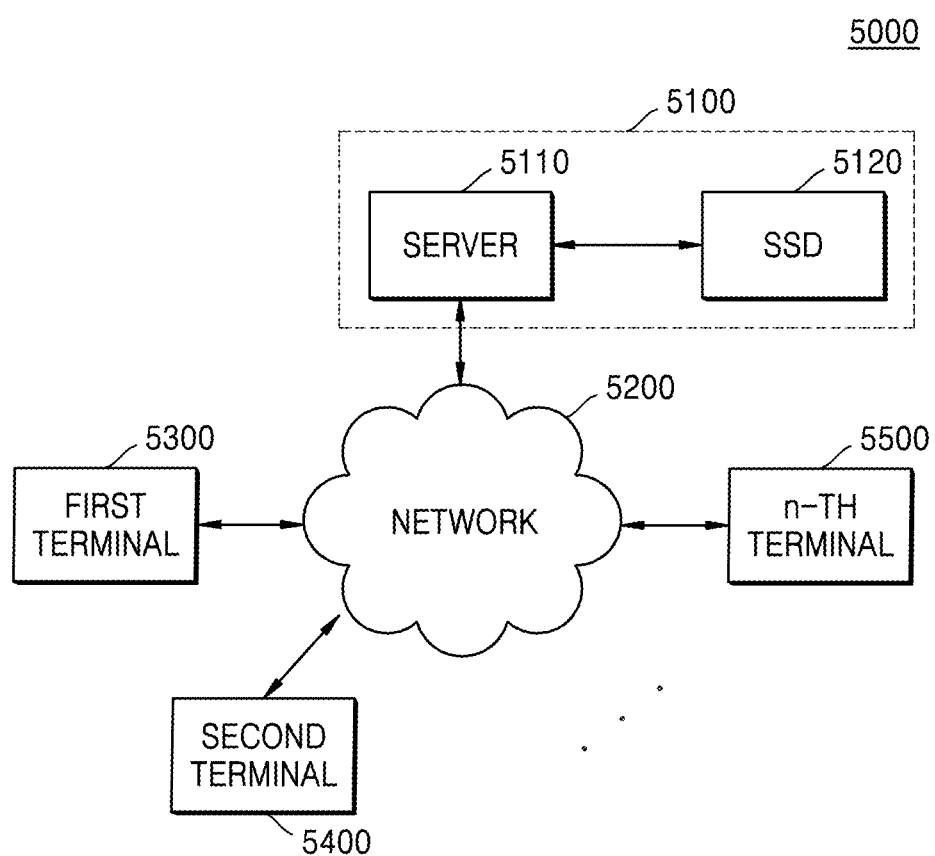
FIG. 12 is a block diagram of a network for a server system including a semiconductor package, according to an embodiment.

FIG. 12 is a block diagram of a network 5200 for a server system 5100 including a semiconductor package 10, according to an embodiment.

Referring to FIG. 12, a network system 5000 may include the server system 5100 and a plurality of terminals (e.g., first, second, and n-th terminals 5300, 5400, and 5500), which are connected through the network 5200.

The server system 5100 may include a server 5110 configured to process requests received from the first, second, and n-th terminals 5300, 5400, and 5500 connected to the network 5200 and an electronic device 5120 configured to store data corresponding to the requests received from the first, second, and n-th terminals 5300, 5400, and 5500.

The electronic device 5120 may correspond to or include the semiconductor package 10 described above with reference to FIG. 2. The electronic device 5120 may be, for example, an SSD.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of manufacturing a semiconductor package, the method comprising:
    providing a first substrate on which a first bump pad is located;
    providing a second substrate on which a second bump pad is located;
    dotting first solder paste on the first bump pad;
    dotting second solder paste on the second bump pad;
    arranging a core material for reverse reflow on the first solder paste;
    arranging the second solder paste on the core material for reverse reflow such that the first bump pad and the second bump pad face each other; and
    performing a reflow process such that the first solder paste and the second solder paste are bonded to each other to form a solder member,
    wherein each of a first diameter of the first bump pad and a second diameter of the second bump pad is at least about 1.1 times greater than a third diameter of the core material for reverse reflow, and
    wherein the core material for reverse reflow comprises:
        a core;
        a first metal layer directly coated on the core, the first metal layer comprising nickel (Ni) or cobalt (Co); and
        a second metal layer directly coated on the first metal layer, the second metal layer comprising gold (Au) or platinum (Pt).

2. The method of claim 1, wherein, during the arranging of the second solder paste on the core material for reverse reflow, the first solder paste and the second solder paste are arranged a predetermined distance apart from each other.

3. The method of claim 1, wherein, during the forming of the solder member, both side surfaces of the solder member are curved surfaces and do not protrude outward from both side surfaces of the first bump pad and both side surfaces of the second bump pad.

4. A method of manufacturing a semiconductor package, the method comprising:
    providing a first substrate on which a first bump pad is located;
    providing a second substrate on which a second bump pad is located;
    adhering a solder ball onto the first bump pad;
    performing a first reflow process such that the solder ball spreads on the first bump pad to form a solder member of which a top surface is rounded;
    planarizing the top surface of the solder member by applying a mechanical pressure to the solder member;
    arranging a core material for reverse reflow on the top surface of the solder member;
    performing a second reflow process on the solder member to form a solder layer on an entire surface of the core material for reverse reflow; and
    arranging the second bump pad on the solder member such that the first bump pad and the second bump pad face each other,
    wherein each of a first diameter of the first bump pad and a second diameter of the second bump pad is at least about 1.1 times greater than a third diameter of the core material for reverse reflow, and
    wherein the core material for reverse reflow comprises:
        a core;
        a first metal layer directly coated on the core, the first metal layer comprising nickel (Ni) or cobalt (Co); and
        a second metal layer directly coated on the first metal layer, the second metal layer comprising gold (Au) or platinum (Pt).

5. The method of claim 4, wherein, after the performing of the second reflow process, the core material for reverse reflow becomes closer to the first bump pad.

6. The method of claim 4, wherein, during the arranging of the second bump pad on the solder member, both side surfaces of the solder member are curved surfaces and do not protrude outward from both side surfaces of the first bump pad and both side surfaces of the second bump pad.

* * * * *